United States Patent
Kao et al.

(10) Patent No.: US 9,577,026 B2
(45) Date of Patent: Feb. 21, 2017

(54) MIM CAPACITOR AND METHOD OF FORMING THE SAME

(71) Applicant: Taiwan Semiconductor Manufacturing Company Limited, Hsinchu (TW)

(72) Inventors: Chih-Wei Kao, Taipei (TW); Chun-Chieh Huang, Hsinchu (TW); Hsiao-Hui Yu, Hsinchu County (TW); Hao-Wen Hsu, Hsinchu (TW); Pin-Cheng Hsu, Hsinchu County (TW); Chia-Der Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 1 day.

(21) Appl. No.: 14/287,391

(22) Filed: May 27, 2014

(65) Prior Publication Data

US 2015/0349047 A1    Dec. 3, 2015

(51) Int. Cl.
*H01L 49/02* (2006.01)
*H01L 27/08* (2006.01)

(52) U.S. Cl.
CPC ........... *H01L 28/60* (2013.01); *H01L 27/0805* (2013.01); *H01L 28/90* (2013.01)

(58) Field of Classification Search
CPC .............................. H01L 28/90; H01L 27/0805
See application file for complete search history.

(56) References Cited

U.S. PATENT DOCUMENTS

| | | | | |
|---|---|---|---|---|
| 7,602,599 B1 * | 10/2009 | Hsu | ........................ | H01G 4/005 361/303 |
| 2007/0045702 A1 * | 3/2007 | Liang | ...................... | H01L 28/40 257/306 |
| 2011/0193194 A1 * | 8/2011 | Takahashi | .............. | H01G 4/008 257/532 |
| 2012/0115300 A1 * | 5/2012 | Hirota | ............... | H01L 27/10817 438/381 |
| 2013/0087845 A1 * | 4/2013 | Yasuda | ............. | H01L 21/28282 257/324 |
| 2015/0129827 A1 * | 5/2015 | Chen | .................... | H01L 27/2481 257/4 |

* cited by examiner

*Primary Examiner* — Lex Malsawma
*Assistant Examiner* — Xia L Cross
(74) *Attorney, Agent, or Firm* — Jones Day

(57) ABSTRACT

According to an exemplary embodiment, a method of forming a MIM capacitor is provided. The method includes the following operations: providing a first metal layer; providing a dielectric layer over the first metal layer; providing a second metal layer over the dielectric layer; etching the second metal layer to define the metal-insulator-metal capacitor; and oxidizing a sidewall of the second metal layer. According to an exemplary embodiment, a MIM capacitor is provided. The MIM capacitor includes a first metal layer; a dielectric layer over the first metal layer; a second metal layer over the dielectric layer; and an oxidized portion in proximity to the second metal layer and made of oxidized second metal layer.

20 Claims, 8 Drawing Sheets

MIM CAPACITOR AND METHOD OF FORMING THE SAME

BACKGROUND

The present invention relates to semiconductor devices, and, more specifically, to metal-insulator-metal (MIM) capacitors and methods of forming MIM capacitors. MIM capacitors typically include two metal layers with an insulator layer between the metal layers. Any damage to the insulator occurring at its corner or its sidewall may induce current leakage and degrade the capacitors' reliability. Therefore, there is a need to solve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
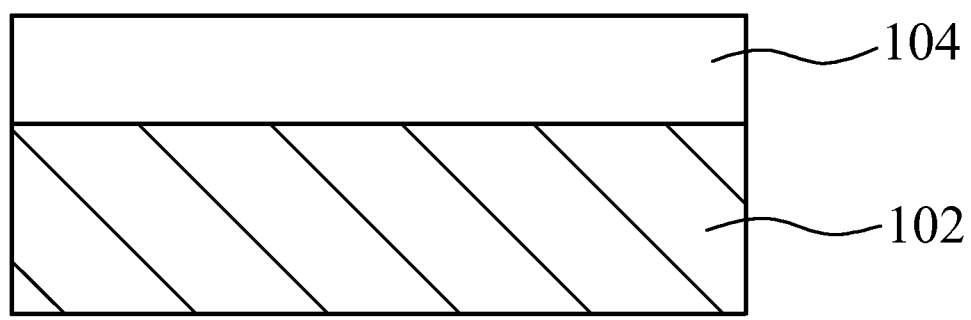
FIG. 1 is a sectional view illustrating an exemplary metal-insulator-metal capacitor in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a MIM capacitor and a method of forming a MIM capacitor. MIM capacitors typically include two metal layers (e.g. a first metal layer and a second metal layer) with an insulator layer between the metal layers. After forming the metal layers and the insulator layer, an etching process may be performed on the second metal layer (the upper) to define an effective area of the MIM capacitor. The etching process may produce damage to the insulator at its corners or its sidewall. The damage to the insulator may induce current leakage and degrade the capacitors' reliability. In addition to during the etching process, the damage on the insulator may be produced by other processes.

In an exemplary embodiment, a MIM capacitor includes a first metal layer, a dielectric layer, a second metal layer, and an oxidized portion. The dielectric layer is disposed over the first metal layer. The second metal layer is disposed over the dielectric layer. The oxidized portion (e.g., $TiO_xN_y$) is in proximity to the second metal layer (e.g., TiN) and made of an oxidized second metal layer. The first metal layer and the second metal layer may be formed of titanium nitride. The oxidized portion may have a width of about 10 angstroms to about 80 angstroms. One skilled in the art will realize, however, that the dimensions and values recited throughout the descriptions are merely examples, and may be changed to suit different scales of integrated circuits.

Therefore, by formation of the oxidized portion, the possibility that the insulator layer with damaged sidewall generates leakage path at its corner or its sidewall is reduced. Moreover, an experiment demonstrates that the MIM capacitor with the oxidized portion has an improved voltage breakdown distribution, including lower tail and better yield, compared to a MIM capacitor without the oxidized portion.

In an exemplary embodiment, the method includes oxidizing a sidewall of the second metal layer after an etching process performed on the second metal layer. The oxidation process may refer to a plasma treatment with nitrous oxide, dioxygen, and ozone. The sidewall of the second metal layer (e.g., TiN) is oxidized to be an oxidized portion (e.g., $TiO_xN_y$) by using $N_2O$ plasma, $O_2$ plasma, $O_3$, and $O_2$ at high temperature, so as to shrink a width or area of the second metal layer and furthermore to shrink an effective width or an effective area of the MIM capacitor. The oxidized portion may have a width of about 10 angstroms to about 80 angstroms.

Therefore, by shrinking the effective width or the effective area of the MIM capacitor, the possibility that the insulator layer with damaged sidewall generates leakage path at its corner or its sidewall is reduced. Moreover, an experiment shows the MIM capacitor with the oxidation process has improvement on voltage breakdown distribution, including lower tail and better yield, compared to a MIM capacitor without the oxidation process.

FIG. 1 is a sectional view illustrating an exemplary metal-insulator-metal capacitor in accordance with some embodiments. As shown in FIG. 1, a first metal layer 102 is provided as a capacitor bottom metal (CBM) made of, for example, titanium nitride. The CBM may be made by using physical vapor deposition. The first metal layer 102 may include a thin layer of a conductive material such as TiN, TaN, or WN, as examples, although alternatively, other conductive materials may be used. A dielectric layer 104 as an insulator is provided over the first metal layer 102. The dielectric layer 104 may include a material suitable for use as a capacitor dielectric, such as, for example, a high dielectric constant material (high-K material).

Figure 2:
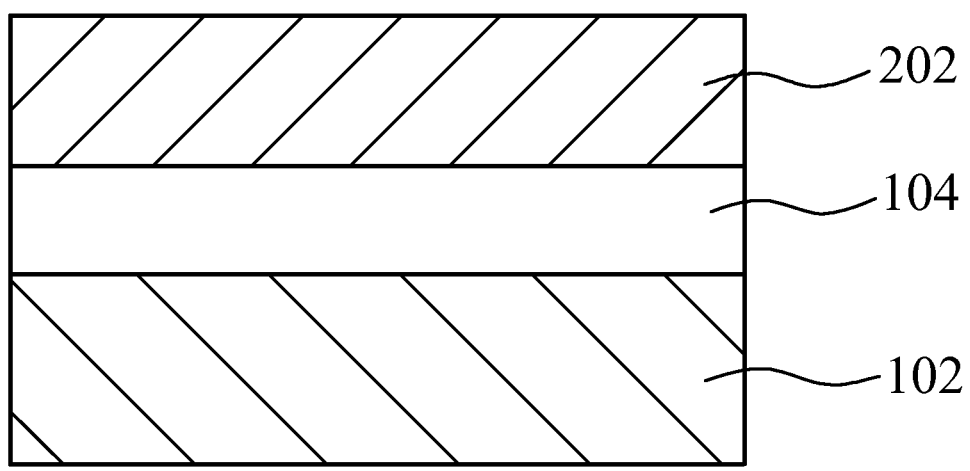
FIG. 2 is a sectional view illustrating the exemplary metal-insulator-metal capacitor in accordance with some embodiments.

FIG. 2 is a sectional view illustrating the exemplary metal-insulator-metal capacitor in accordance with some embodiments. As shown in FIG. 2, a second metal layer 202 is provided as a capacitor top metal (CTM) made of, for example, titanium nitride. The CTM may be made by using physical vapor deposition. The second metal layer 202 may include a thin layer of a conductive material such as TiN, TaN, or WN, as examples, although alternatively, other conductive materials may be used. The second metal layer 202 is provided over the dielectric layer 104.

Figure 3:
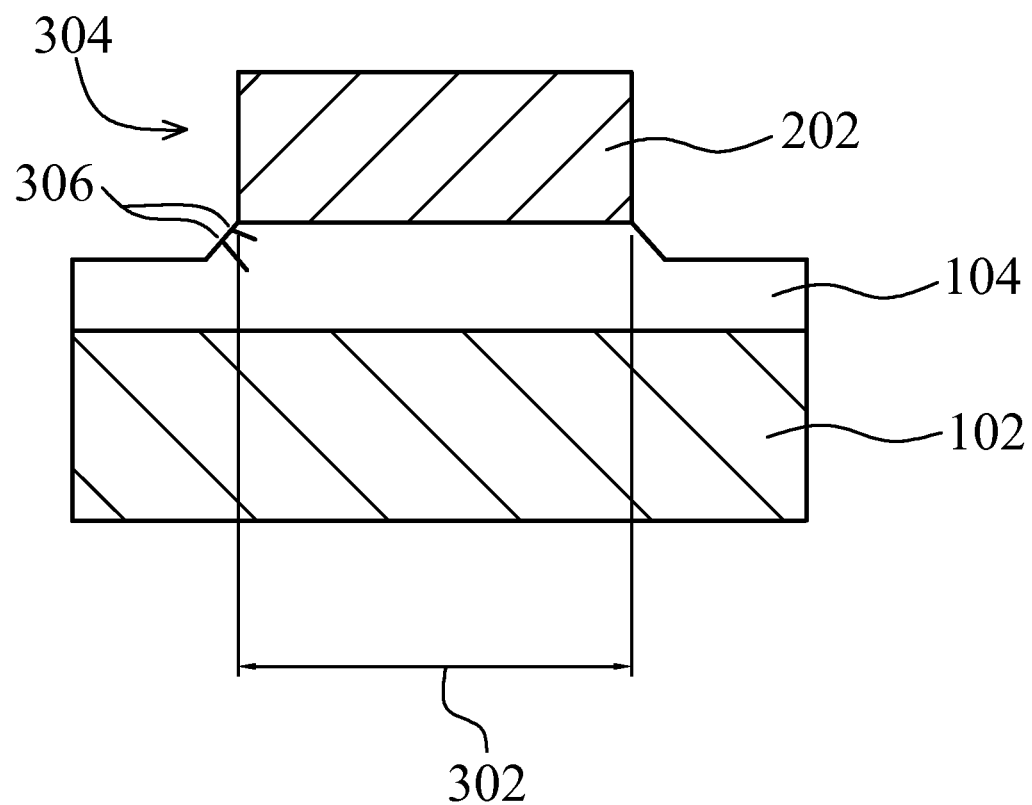
FIG. 3 is a sectional view illustrating the exemplary metal-insulator-metal capacitor in accordance with some embodiments.

FIG. 3 is a sectional view illustrating the exemplary metal-insulator-metal capacitor in accordance with some embodiments. As shown in FIG. 3, the second metal layer 202 and dielectric layer 104 is etched to define a MIM capacitor 304. In the embodiment, the MIM capacitor 304 has an effective width (or effective area) 302. The dielectric layer 104 has cracks 306 produced by the etching of the second metal layer 202 and the dielectric layer 104. The cracks 306 on the dielectric layer 104 (as insulator) entering the effective width 302 may induce current leakage and degrade the capacitors' reliability.

Figure 4:
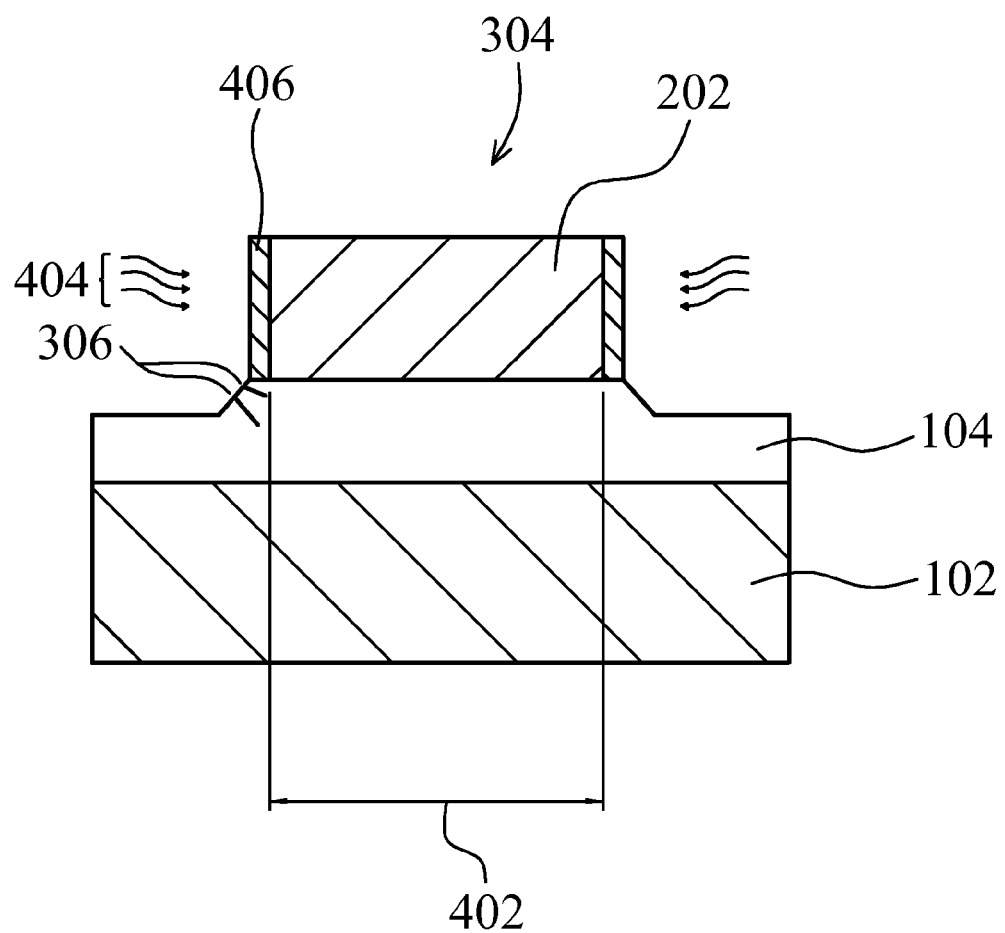
FIG. 4 is a sectional view illustrating the exemplary metal-insulator-metal capacitor in accordance with some embodiments.

FIG. 4 is a sectional view illustrating the exemplary metal-insulator-metal capacitor in accordance with some embodiments. As shown in FIG. 4, a sidewall of the second metal layer 202 is oxidized by using, for example, a plasma treatment 404 with nitrous oxide, dioxygen, and ozone. For example, the sidewall of the second metal layer 202 (e.g., TiN) is oxidized to be an oxidized portion 406 (e.g., $TiO_xN_y$) by using $N_2O$ plasma, $O_2$ plasma, $O_3$, and $O_2$ at a high temperature. The effective width (or effective area) 302 of the MIM capacitor 304 in FIG. 3 is shrunk to be the effective width (or effective area) 402 in FIG. 4. The width of the oxidized portion 406, which is a difference between the effective width 302 and the effective width 402, is about 10 angstroms to about 80 angstroms.

In the embodiment, by shrinking the effective width from the width 302 to the width 402 of the MIM capacitor 304, a substantial portion of the cracks 306 in the dielectric layer 104 no longer enters the effective width 402, thus reducing the inducement of current leakage and degradation of the capacitor's 304 reliability.

Figure 5:
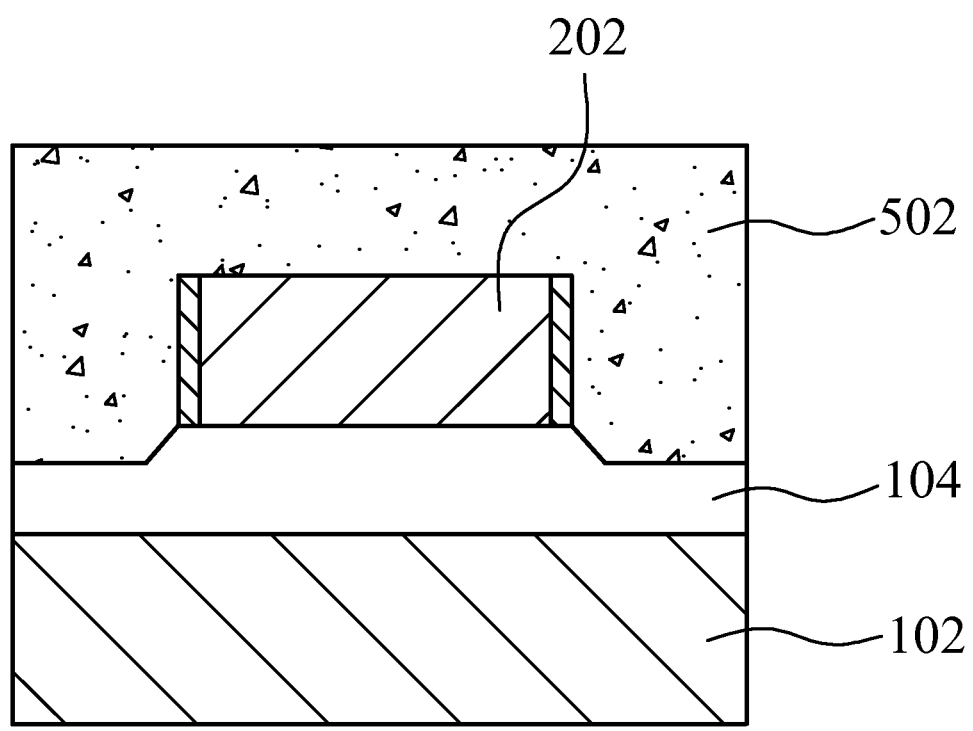
FIG. 5 is a sectional view illustrating the exemplary metal-insulator-metal capacitor in accordance with some embodiments.

FIG. 5 is a sectional view illustrating the exemplary metal-insulator-metal capacitor in accordance with some embodiments. As shown in FIG. 5, a protection layer 502 is provided over the dielectric layer 104 and the second metal layer 202. The protection layer 502 may be made of, for example, silicon nitride and silicon oxide.

Figure 6:
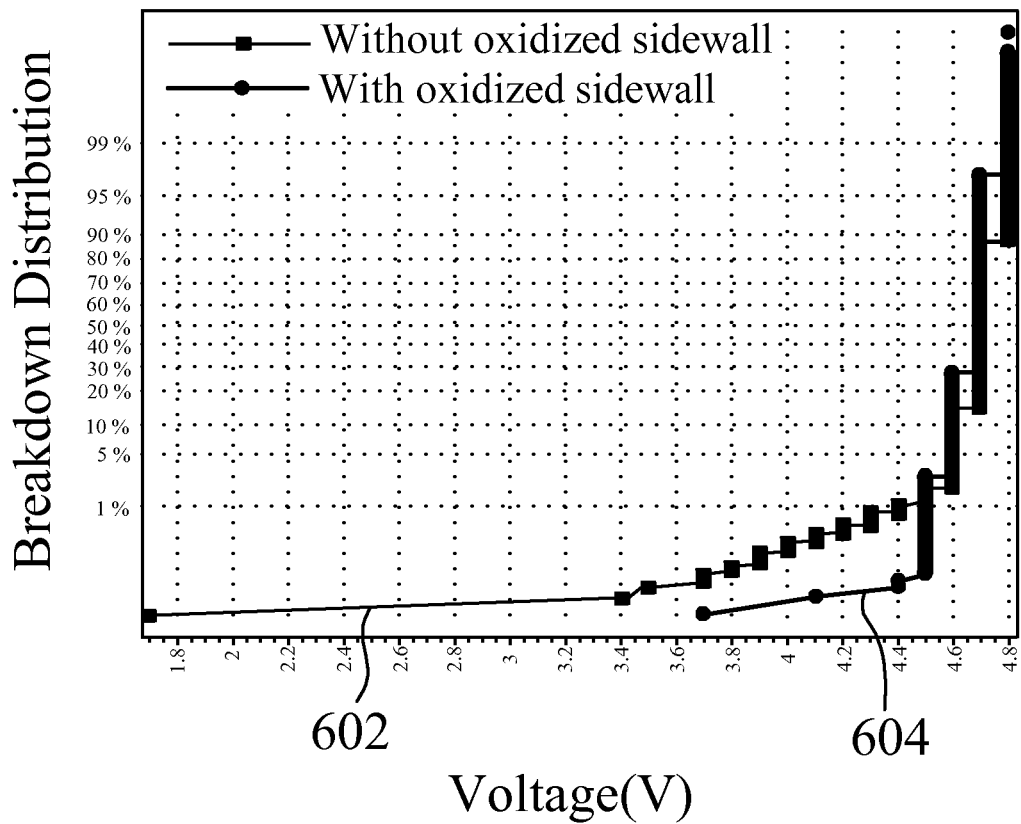
FIG. 6 is a plot illustrating experimental result of the exemplar metal-insulator-metal capacitor in accordance with some embodiments.

FIG. 6 is a plot illustrating experimental result of the exemplar metal-insulator-metal capacitor in accordance with some embodiments. A wafer acceptance test (WAT) of voltage breakdown distribution (VBD) is performed on the MIM capacitor. The horizontal axis refers to the voltage applied to the metal layers of the MIM capacitor. The vertical axis refers to possibility of MIM capacitor breakdown. We made two experiments to obtain the two results 602, 604.

In one experiment, we setup the MIM capacitor as the configuration in FIG. 4 to obtain the result 604. As shown in FIG. 4, the oxidized sidewall 406 is in proximity to the second metal layer 202 and made of an oxidized second metal layer. In the other experiment, we setup the MIM capacitor without the aforementioned oxidized sidewall. It is demonstrated in FIG. 6 that the MIM capacitor with the oxidized sidewall (corresponding to the result 604) has improved voltage breakdown distribution, including lower tail and better yield, compared to that without the oxidized sidewall (corresponding to the result 602).

Figure 7:
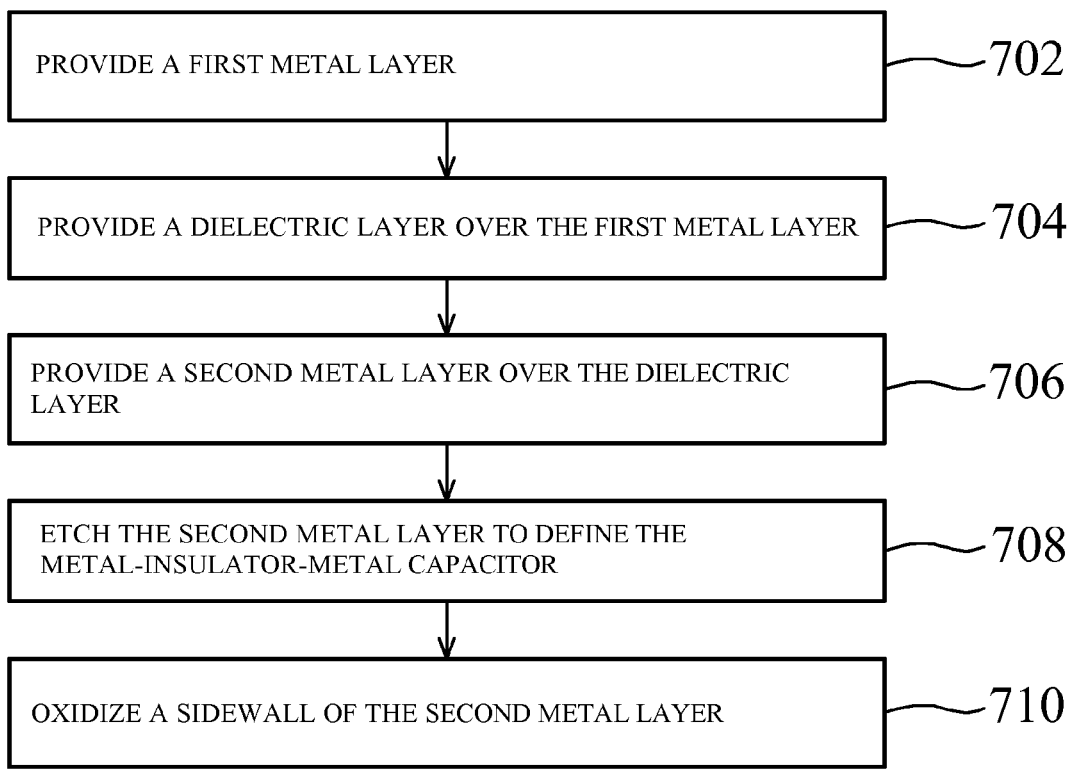
FIG. 7 is a flow chart for a method forming a metal-insulator-metal capacitor in accordance with some embodiments.

FIG. 7 is a flow chart for a method forming a MIM capacitor in accordance with some embodiments. As shown in FIG. 7, a method 700 is provided. The method 700 includes the following operations: providing a first metal layer (702); providing a dielectric layer over the first metal layer (704); providing a second metal layer over the dielectric layer (706); etching the second metal layer to define the metal-insulator-metal capacitor (708); and oxidizing a sidewall of the second metal layer (710).

As such, by oxidizing the sidewall of the second metal layer to shrink the effective width or the effective area of the MIM capacitor, the possibility that the insulator layer with damaged sidewall generates leakage path at its corner or its sidewall is reduced. Moreover, an experiment shows the MIM capacitor with the oxidation process has an improved voltage breakdown distribution, including lower tail and better yield, compared to that without the oxidation process.

In the embodiment, the operation 710 further includes: oxidizing the sidewall of the second metal layer by using a plasma treatment with nitrous oxide, dioxygen, and ozone to shrink a width of the second metal layer. Oxidation of the sidewall of the second metal layer may form an oxidized portion having a width of about 10 angstroms to about 80 angstroms. The method 700 may further include forming a protection layer made of silicon nitride and silicon oxide over the dielectric layer and the second metal layer.

In the embodiment, the operation 702 may further include providing the first metal layer as a capacitor bottom metal made of titanium nitride by using physical vapor deposition. The operation 706 may further include providing the second metal layer as a capacitor top metal made of titanium nitride over the dielectric layer by using physical vapor deposition. The operation 704 may further include providing the dielectric layer made of a high-K material over the first metal layer.

Figure 8:
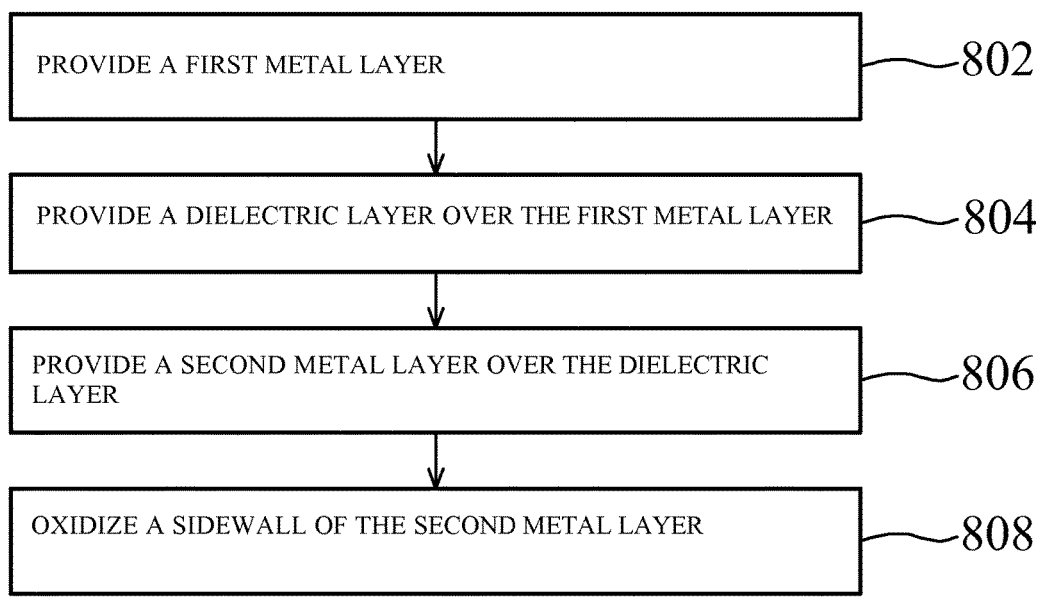
FIG. 8 is a flow chart for a method forming a metal-insulator-metal capacitor in accordance with some embodiments.

FIG. 8 is a flow chart of a method for forming a MIM capacitor in accordance with some embodiments. As shown in FIG. 8, a method 800 is provided. The method 700 includes the following operations: providing a first metal layer (802); providing a dielectric layer over the first metal layer (804); providing a second metal layer over the dielectric layer (806); and oxidizing a sidewall of the second metal layer (808).

By oxidizing the sidewall of the second metal layer to shrink the effective width or the effective area of the MIM capacitor, the possibility that the insulator layer with damaged sidewall generates leakage path at its corner or its sidewall is reduced. Moreover, an experiment shows the MIM capacitor with the oxidation process has improved voltage breakdown distribution, including lower tail and better yield, compared to that without the oxidation process.

In the embodiment, the operation 808 may further include oxidizing the sidewall of the second metal layer by using a plasma treatment with nitrous oxide, dioxygen, and ozone to oxidize the sidewall of the second metal layer to shrink a width of the second metal layer. The oxidized portion may have a width of about 10 angstroms to about 80 angstroms. The method 800 may further include forming a protection layer made of silicon nitride and silicon oxide over the dielectric layer and the second metal layer.

In the embodiment, the operation 802 may further include providing the first metal layer as a capacitor bottom metal made of titanium nitride by using physical vapor deposition. The operation 806 may further include providing the second metal layer as a capacitor top metal made of titanium nitride over the dielectric layer by using physical vapor deposition. The operation 804 may further include providing the dielectric layer made of a high-K material over the first metal layer.

According to an exemplary embodiment, a method of forming a MIM capacitor is provided. The method includes the following operations: providing a first metal layer; providing a dielectric layer over the first metal layer; providing a second metal layer over the dielectric layer; etching the second metal layer to define the metal-insulator-metal capacitor; and oxidizing a sidewall of the second metal layer.

According to an exemplary embodiment, a method of forming a MIM capacitor is provided. The method includes the following operations: providing a first metal layer; providing a dielectric layer over the first metal layer; providing a second metal layer over the dielectric layer; and oxidizing a sidewall of the second metal layer.

According to an exemplary embodiment, a MIM capacitor is provided. The MIM capacitor includes a first metal layer; a dielectric layer over the first metal layer; a second metal layer over the dielectric layer; and an oxidized portion in proximity to the second metal layer and made of oxidized second metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a metal-insulator-metal capacitor, comprising:
    providing a first metal layer;
    providing a dielectric layer, consisting of high-K material, over the first metal layer;
    providing a second metal layer over the dielectric layer;
    etching downward fully through the second metal layer and, further downward, only partially through the dielectric layer, to define the metal-insulator-metal capacitor in which (i) the second metal layer has a sidewall that is newly-formed by the etching and that is at a first location, (ii) the dielectric layer includes both a sidewall and an upwardly-facing surface that are newly-formed by the etching, and (iii) the second metal layer's sidewall directly contacts, and extends upward from, the dielectric layer's sidewall; and
    oxidizing the sidewall of the second metal layer of the metal-insulator-metal capacitor, to produce an oxidized layer that is formed from the second metal layer's sidewall and is in place of the second metal layer's sidewall, wherein an interface between the oxidized layer and the second metal layer is located horizontally inward from the first location, and during the oxidizing, the dielectric layer remains consisting of the high-K material and the dielectric layer's sidewall remains below the first location.

2. The method of claim 1, wherein oxidizing the sidewall of the second metal layer uses a plasma treatment with nitrous oxide, dioxygen and ozone.

3. The method of claim 1, wherein oxidizing the sidewall of the second metal layer shrinks a width of the second metal layer.

4. The method of claim 1, wherein oxidizing the sidewall of the second metal layer results in the oxidized layer having a width of about 10 angstroms to about 80 angstroms.

5. The method of claim 1, further comprising:
    forming a protection layer made of silicon nitride and silicon oxide over the dielectric layer and the second metal layer.

6. The method of claim 1, wherein providing the first metal layer further comprises providing the first metal layer as a capacitor bottom metal made of titanium nitride by using physical vapor deposition.

7. The method of claim 1, wherein providing the second metal layer over the dielectric layer further comprises providing the second metal layer as a capacitor top metal made of titanium nitride over the dielectric layer by using physical vapor deposition.

8. The method of claim 1, wherein the etching produces a crack in the dielectric layer, and a portion of the crack is located under the width of the second metal layer, and the oxidizing shrinks the width of the second metal layer such that the portion of the crack is no longer under the width of the second metal layer.

9. A method of forming a metal-insulator-metal capacitor, comprising:
    providing a first metal layer;
    providing a dielectric layer, consisting of high-K material, over the first metal layer;
    providing a second metal layer over the dielectric layer;
    etching downward fully through the second metal layer and, further downward, only partially through the dielectric layer, to define the metal-insulator-metal capacitor; and
    oxidizing a sidewall of the second metal layer of the metal-insulator-metal capacitor to shrink a width of the second metal layer by producing an oxidized layer that is formed from the second metal layer's sidewall and is in place of the second metal layer's sidewall, such that (i) the oxidized layer has a sidewall that directly contacts, and extends upward from, a sidewall of the dielectric layer, (ii) an interface between the oxidized layer and the second metal layer is located horizontally inward from the dielectric layer's sidewall, and (iii) during the oxidizing, the dielectric layer remains consisting of the high-K material.

10. The method of claim 9, wherein oxidizing the sidewall of the second metal layer uses a plasma treatment with nitrous oxide, dioxygen and ozone.

11. The method of claim 9, wherein oxidizing the sidewall of the second metal layer results in the oxidized layer having a width of about 10 angstroms to about 80 angstroms.

12. The method of claim 9, further comprising forming a protection layer made of silicon nitride and silicon oxide over the dielectric layer and the second metal layer.

13. The method of claim 9, wherein providing the first metal layer further comprises providing the first metal layer as a capacitor bottom metal made of titanium nitride by using physical vapor deposition.

14. The method of claim 9, wherein providing the second metal layer over the dielectric layer further comprises providing the second metal layer as a capacitor top metal made of titanium nitride over the dielectric layer by using physical vapor deposition.

15. The method of claim 9, wherein the etching produces a crack in the dielectric layer, and a portion of the crack is located under the width of the second metal layer, and the oxidizing shrinks the width of the second metal layer such that the portion of the crack is no longer under the width of the second metal layer.

16. A method of forming a metal-insulator-metal capacitor, comprising:
providing a first metal layer;
providing a dielectric layer over the first metal layer;
providing a second metal layer over the dielectric layer;
etching the second metal layer to define the metal-insulator-metal capacitor and to form a sidewall of the dielectric layer and a sidewall of the second metal layer, wherein the etching produces a crack in the dielectric layer, and a portion of the crack is located under the width of the second metal layer; and
oxidizing the sidewall of the second metal layer of the metal-insulator-metal capacitor to shrink the width of the second metal layer such that the portion of the crack is no longer under the width of the second metal layer, by forming an oxidized layer that is formed from the second metal layer's sidewall and is in place of the second metal layer's sidewall.

17. The method of claim 16, wherein oxidizing the sidewall of the second metal layer further comprises oxidizing the sidewall of the second metal layer by using a plasma treatment with nitrous oxide, dioxygen and ozone.

18. The method of claim 16, further comprising forming a protection layer made of silicon nitride and silicon oxide over the dielectric layer and the second metal layer.

19. The method of claim 16, wherein providing the first metal layer further comprises providing the first metal layer as a capacitor bottom metal made of titanium nitride by using physical vapor deposition.

20. The method of claim 16, wherein the oxidized layer has a sidewall that directly contacts, and extends upward from, the sidewall of the dielectric layer, and an interface between the oxidized layer and the second metal layer is located horizontally inward from the dielectric layer's sidewall.

* * * * *